(12) United States Patent
Inagaki et al.

(10) Patent No.: US 9,716,059 B2
(45) Date of Patent: Jul. 25, 2017

(54) PACKAGE SUBSTRATE AND METHOD FOR MANUFACTURING PACKAGE SUBSTRATE

(71) Applicant: IBIDEN CO., LTD., Ogaki-shi (JP)

(72) Inventors: Yasushi Inagaki, Ogaki (JP); Osamu Futonagane, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 14/840,236

(22) Filed: Aug. 31, 2015

(65) Prior Publication Data
US 2016/0064318 A1 Mar. 3, 2016

(30) Foreign Application Priority Data
Sep. 2, 2014 (JP) ................................ 2014-177849

(51) Int. Cl.
H05K 1/11 (2006.01)
H01L 23/498 (2006.01)
H01L 21/48 (2006.01)
H01L 23/50 (2006.01)

(52) U.S. Cl.
CPC ...... H01L 23/49822 (2013.01); H01L 21/486 (2013.01); H01L 23/49827 (2013.01); H01L 23/49838 (2013.01); H01L 21/4857 (2013.01); H01L 23/49811 (2013.01); H01L 23/50 (2013.01); H01L 2224/16227 (2013.01); H01L 2224/32225 (2013.01); H01L 2224/73204 (2013.01); H01L 2924/15192 (2013.01); H01L 2924/15311 (2013.01)

(58) Field of Classification Search
None
See application file for complete search history.

(56) References Cited

U.S. PATENT DOCUMENTS 6,456,502 B1 * 9/2002 Miller .................... H05K 1/023
174/250
2005/0218502 A1 * 10/2005 Sunohara .......... H01L 23/49822
257/700

(Continued)

FOREIGN PATENT DOCUMENTS

JP 06-053349 A 2/1994

Primary Examiner — Steven T Sawyer
(74) Attorney, Agent, or Firm — Oblon, McClelland, Maier & Neustadt, L.L.P.

(57) ABSTRACT

A package substrate includes an outermost interlayer, an outermost conductive layer including first pads positioned to mount at electronic component and second pads positioned to mount another electronic component, a first conductive layer including first circuits and formed such that the outermost interlayer is on the first conductive layer and that the first circuits are connecting the first and second pads, an inner interlayer formed such that the first conductive layer is on the inner interlayer, a second conductive layer formed such that the inner interlayer is on the second conductive layer, via conductors penetrating through the outermost interlayer and including first via conductors connecting the first conductive layer and the first pads and second via conductors connecting the first conductive layer and the second pads, and third via conductors penetrating through the inner interlayer and positioned such that the first and third via conductors form stacked via conductors.

20 Claims, 10 Drawing Sheets

(56) References Cited

U.S. PATENT DOCUMENTS

| | | | |
|---|---|---|---|
| 2006/0192282 A1* | 8/2006 | Suwa | H01L 23/50 |
| | | | 257/723 |
| 2009/0129039 A1* | 5/2009 | Kariya | H05K 1/162 |
| | | | 361/782 |
| 2009/0288870 A1* | 11/2009 | Kondo | H01L 21/4846 |
| | | | 174/261 |
| 2010/0065318 A1* | 3/2010 | Nagasawa | H01L 23/49827 |
| | | | 174/260 |
| 2014/0374150 A1 | 12/2014 | Inagaki et al. | |

* cited by examiner

US 9,716,059 B2

PACKAGE SUBSTRATE AND METHOD FOR MANUFACTURING PACKAGE SUBSTRATE

CROSS-REFERENCE TO RELATED APPLICATIONS

The present application is based upon and claims the benefit of priority to Japanese Patent Application No. 2014-177849, filed Sep. 2, 2014, the entire contents of which are incorporated herein by reference.

BACKGROUND OF THE INVENTION

Field of the Invention

The present invention relates to a package substrate for mounting multiple electronic components, and to a method for manufacturing such a package substrate.

Description of Background Art

JP H06-53349A describes a multi-chip module. According to JP H06-53349A, two LSIs are mounted on a substrate. The two LSIs are connected through multiple wiring layers. The multiple wiring layers are patterned on different insulation layers in JP H06-53349A. The entire contents of this publication are incorporated herein by reference.

SUMMARY OF THE INVENTION

According to one aspect of the present invention, a package substrate includes an outermost insulating resin interlayer, an outermost conductive layer formed on a surface of the outermost insulating resin interlayer and including first pads and second pads such that the first pads are positioned to mount a first electronic component and the second pads are positioned to mount a second electronic component, a first conductive layer including first conductive circuits and formed such that the outermost insulating resin interlayer is formed on the first conductive layer and that the first conductive circuits are connecting the first pads and the second pads, respectively, an inner insulating resin interlayer formed such that the first conductive layer is formed on the inner insulating resin interlayer, a second conductive layer formed such that the inner insulating resin interlayer is formed on the second conductive layer, via conductors penetrating through the outermost insulating resin interlayer and including first via conductors and second via conductors such that the first via conductors are connecting the first conductive layer and the first pads and that the second via conductors are connecting the first conductive layer and the second pads, and third via conductors penetrating through the inner insulating resin interlayer and positioned such that the first via conductors and third via conductors form stacked via conductors penetrating through the outermost and inner insulating resin interlayers.

According to another aspect of the present invention, a method for manufacturing a package substrate includes forming conductive circuits on an inner insulating resin interlayer, forming via conductors through the inner insulating resin interlayer, forming an outermost insulating resin interlayer on the inner insulating resin interlayer such that the outermost insulating resin interlayer covers the conductive circuits, forming via conductors including first via conductors and second via conductors such that the first via conductors and the second via conductors penetrate through the outermost insulating resin interlayer and connect to the conductive circuits on the inner insulating resin interlayer and that the first via conductors and the via conductors in the inner insulating resin interlayer form stacked via conductors penetrating through the outermost and inner insulating resin interlayers, and forming on the outermost insulating resin interlayer an outermost conductive layer including first pads and second pads such that the first pads are positioned to mount a first electronic component and connected to the first via conductors, that the second pads are positioned to mount a second electronic component and connected to the second via conductors and that the first and second pads are connected through the conductive circuits, respectively.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
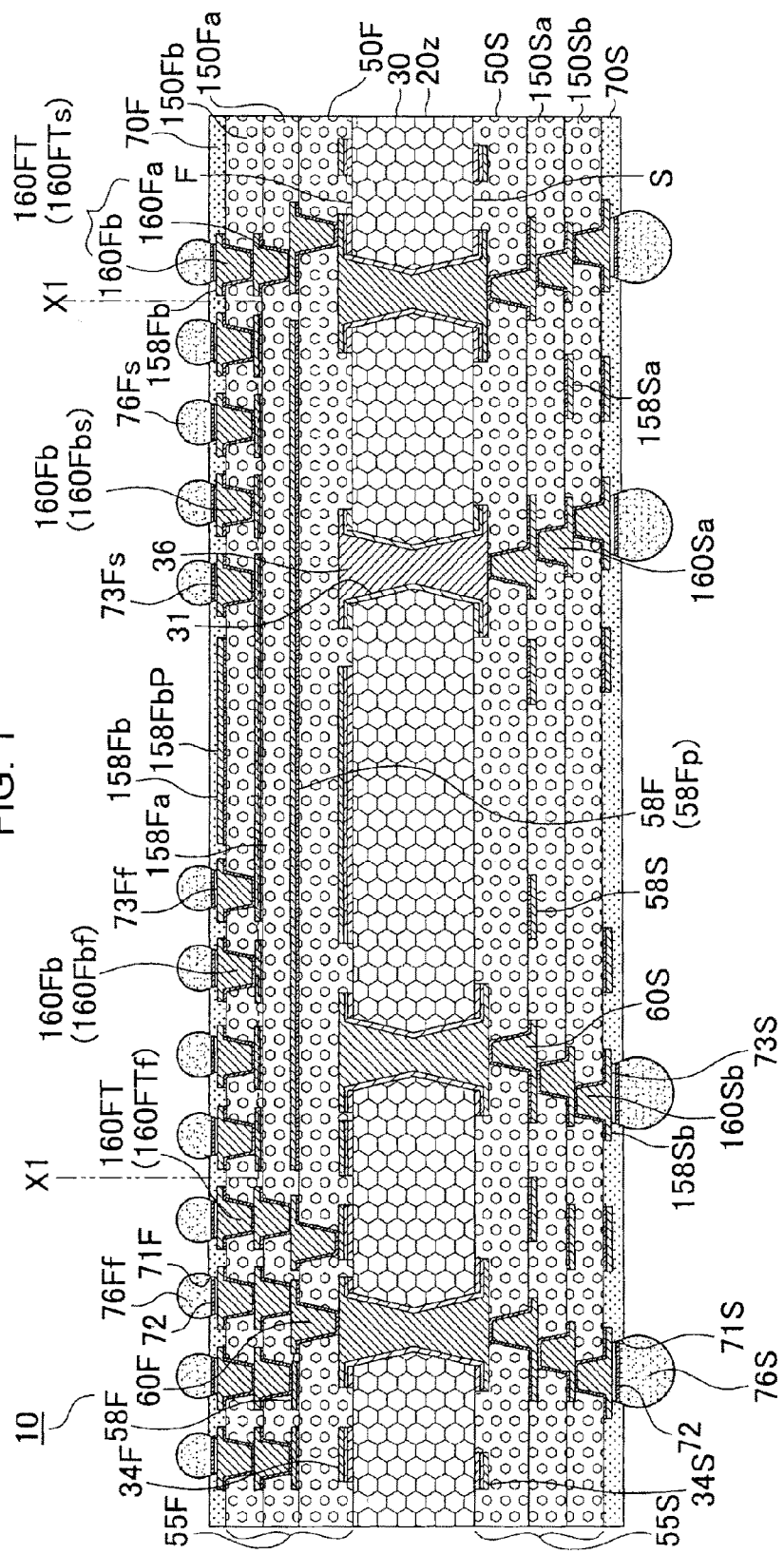
FIG. 1 shows a cross-sectional view of a package substrate according to a first embodiment of the present invention.

The embodiments will now be described with reference to the accompanying drawings, wherein like reference numerals designate corresponding or identical elements throughout the various drawings.

Embodiment

Figure 7A:
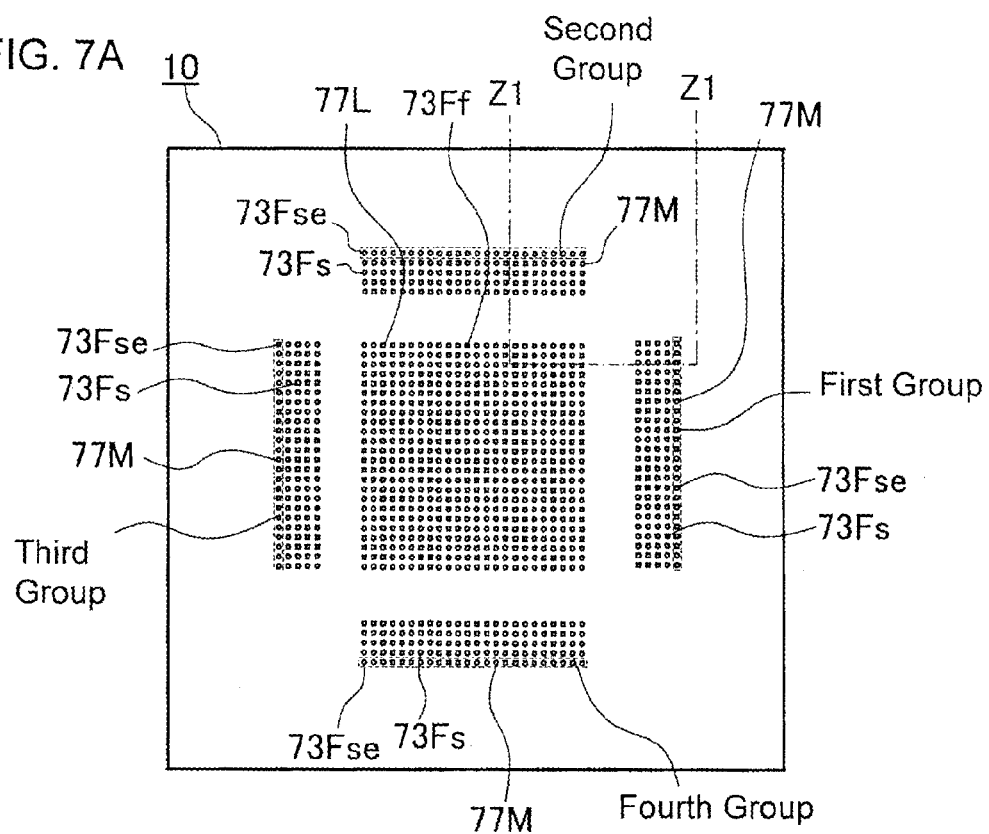
FIG. 7A is a plan view showing pad groups.
Figure 7B:
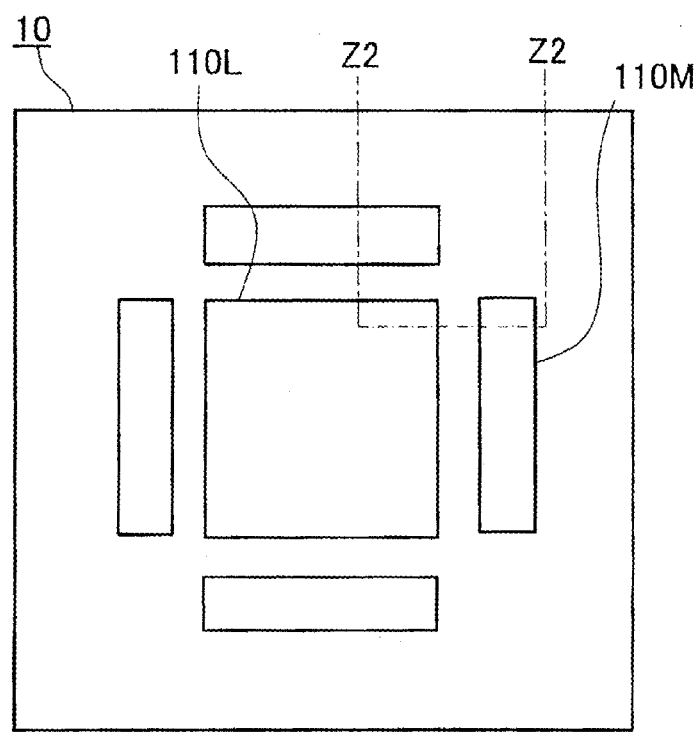
FIG. 7B is a plan view showing an applied example.

FIG. 7(A) shows the mounting surface of a package substrate according to a first embodiment of the present invention. FIG. 7(B) is a plan view of an applied example of the embodiment showing electronic components mounted on the package substrate of the embodiment. As shown in FIG. 7(A), mounting region (77L) for mounting a first electronic component such as a logic IC is formed in the central portion of the mounting surface of the package substrate. In mounting region (77L), first pads (73Ff) for mounting a first electronic component are formed in a grid pattern in mounting region (77L). A first pad group is made up of multiple first pads (73Ff). Solder bumps for mounting a first electronic component are formed on the first pads. Mounting region (77M) for mounting a second electronic component such as a memory is formed on the outer side of mounting region (77L). Four mounting regions (77M) are formed around mounting region (77L) in FIG. 7(A). Second pads (73Fs) for mounting a second electronic component are formed in a grid pattern in each mounting region (77M). A second pad group is made up of multiple second pads. Solder bumps for mounting a second electronic component are formed on the second pads. In FIG. 7(B), logic IC (110L) is mounted on the solder bumps formed in mounting region (77L) and memory (110M) is mounted on solder bumps formed in mounting region (77M).

Figure 2:
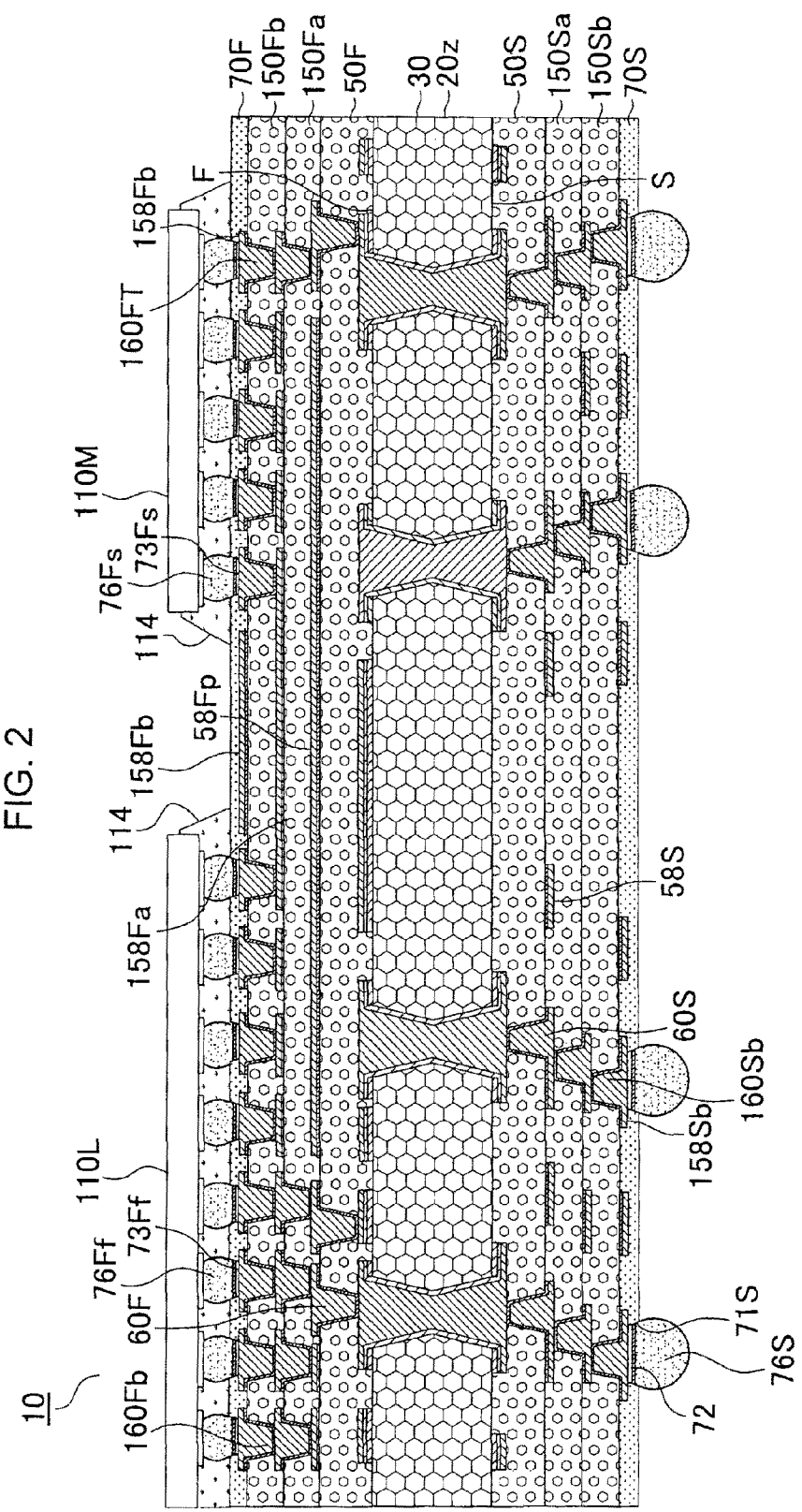
FIG. 2 shows a cross-sectional view of an applied example of the package substrate according to the first embodiment.

FIG. 1 shows a cross section of a package substrate of an embodiment taken at (Z1-Z1) lines in FIG. 7(A). FIG. 2 shows a cross section of an applied example of the package substrate of the embodiment taken at (Z2-Z2) lines in FIG. 7(A). Solder bumps (76Ff) for mounting first electronic component (110L) are formed on first pads (73Ff). Solder bumps (76Fs) for mounting second electronic component (110M) are formed on second pads (73Fs). Second pads (73Fse) positioned in the outermost row of second pads (73Fs) are for power source or ground.

As shown in FIG. 1, a package substrate of an embodiment is provided with outermost conductive layer (158Fb), which includes the pads for mounting electronic components. The package substrate is further provided with outermost insulating resin interlayer (150Fb), which supports outermost conductive layer (158Fb). Outermost insulating resin interlayer (150Fb) has an upper first surface and a lower second surface.

First via conductors (160Fbf) connected to first pads (73Ff) and second via conductors (160Fbs) connected to second pads (73Fs) are formed in outermost insulating resin interlayer (150Fb) of the embodiment. A first via conductor (160Fbf) is preferred to be formed directly under a first pad (73Ff). A second via conductor (160Fbs) is preferred to be formed directly under a second pad (73Fs). First conductive layer (158Fa) including multiple first conductive circuits is formed under outermost insulating resin interlayer (150Fb). First pads and second pads are connected by first conductive circuits. Namely, signal transmission or the like between first and second electronic components is carried out through the first conductive layer. Each of the first conductive circuits is set to connect a first pad and a second pad. The conductive circuits formed on the same plane as the first conductive circuits are all included in the first conductive layer. The first conductive layer is set to be a dedicated wiring layer for performing signal transmission between first and second electronic components. The first conductive layer includes no other conductive circuits but those conductive circuits (signal lines) for performing signal transmission between first and second electronic components. The first conductive layer works as the dedicated wiring layer for data transmission between first and second electronic components.

1 bit of data may be transmitted through one signal line (one first conductive circuit). Commands or data in an electronic device such as a personal computer are composed of bytes (8 bits in 1 byte). Different widths or thicknesses of signal lines cause the electrical characteristics of signal lines, such as transmission speed, to vary. Accordingly, transmission time is thought to differ among signals in bytes. Signals may not be processed properly, or processing time may be prolonged. Transmission time of each bit in a 1-byte signal is thought to vary. In addition, due to variations in the widths or thicknesses of signal lines, there may be a signal line with slower transmission speed. Accordingly, such a slow transmission line is thought to cause slow signal processing.

There is a dedicated wiring layer formed in the embodiment. When a conductive layer that includes signal lines (dedicated wiring layer) is formed, manufacturing conditions are set based on the width and thickness of the signal lines. Accordingly, signal lines of the embodiment show smaller variations in their widths and thicknesses, resulting in substantially the same transmission speed in each signal line. Signals are processed properly. Even a greater amount of data will not cause slow processing speed. Dedicated wiring layers based on the functions of electronic components can be formed in multiple layers of a package substrate of the embodiment. However, when multiple dedicated wiring layers are formed, differences in widths and thicknesses of signal lines are thought to be widened. Therefore, the number of dedicated wiring layers is preferred to be one, so as to reduce variations in transmission time between electronic components. Even if dedicated wiring layers are set in different layers, since each layer contains only data transmission lines, differences in transmission time are small. One conductive layer includes all the conductive circuits sandwiched between two insulating resin interlayers. However, circuits such as dummy conductors that do not transmit signals or power are not counted as conductive circuits.

Inner insulating resin interlayer (150Fa) is formed under the outermost insulating resin interlayer and the first conductive layer (dedicated wiring layer). The outermost insulating resin interlayer and the first conductive layer (dedicated wiring layer) are supported by the inner insulating resin interlayer. In FIG. 1, the conductive circuits sandwiched between the inner insulating resin interlayer and the outermost insulating resin interlayer are all first conductive circuits. The outermost insulating resin interlayer is preferred to be formed directly on the dedicated wiring layer and the inner insulating resin interlayer, because the distance between electronic components and the dedicated wiring layer is shortened.

Figure 10A:
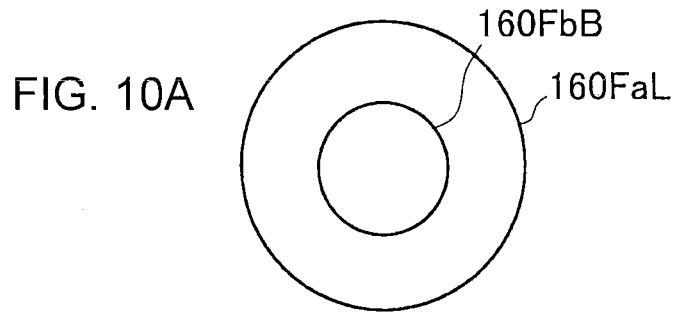
FIGS. 10A-10C show schematic views of stacked vias.
Figure 10B:
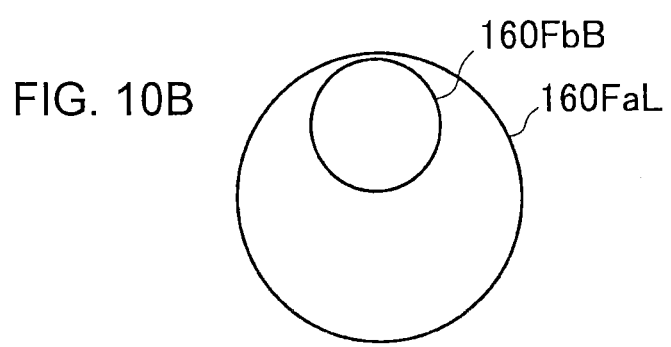
Figure 10C:
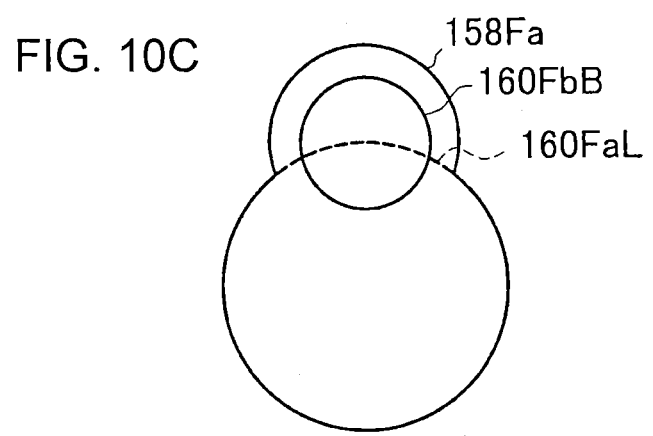

Second conductive layer (58F) that includes multiple second conductive circuits is formed under inner insulating resin interlayer (150Fa). Power supply and the like to the electronic components are carried out through the second conductive layer. Thus, the first pads and second pads include pads connected to the second conductive layer. The second conductive layer and a pad connected to the second conductive layer are connected through stacked via conductor (160FT). In stacked via conductor (160FT), a via conductor (160Fb) penetrating through outermost insulating resin interlayer (150Fb) is positioned on via conductor (third via conductor) (160Fa) penetrating through inner insulating resin interlayer (150Fa). Namely, in a stacked via conductor, bottom (160FbB) of a first via conductor (or second via conductor) is completely in contact with land (160FaL) of a third via conductor as shown in FIG. 10(A) and 10(B). When bottom (160FbB) of a first via conductor (or second via conductor) is positioned partially off land (160FaL) of a third via conductor as shown in FIG. 10(C), it is not a stacked via. In the embodiment, outermost conductive layer (158Fb) and second conductive layer (58F) are connected by stacked vias. Therefore, compared with a structure where a skip via conductor penetrates through the outermost insulating resin interlayer and inner insulating resin interlayer, resin residue is unlikely to remain on the via bottom and connection reliability is enhanced. Since via conductor (160Fb) for mainly supplying power is stacked directly on via conductor (160Fa), a power-source route is shortened and a large amount of current is supplied in a short period of time.

First conductive circuits connecting first electronic component (110L) and second electronic component (110M) and mainly used for data transmission are formed in the central portion of a package substrate, whereas stacked via conductors (160FT) mainly used for power supply to first electronic component (110L) and second electronic component (110M) are mostly positioned on the periphery of the package substrate. First conductive circuits in first conductive layer (158Fa) are concentrated in the central portion of a package substrate, whereas via lands (160FaL) of via conductors (160Fa) of stacked via conductors (160FT) are scattered on the periphery of first conductive layer (158Fa); namely, conductors of the first conductive layer are not concentrated in the central portion but are dispersed in its entire region. Accordingly, highly rigid conductors are dispersed in the entire region, thereby suppressing warping of the package substrate. As described above with reference to FIG. 7(A), second pads (73Fse) in the outermost row of second pads (73Fs) are used for power supply or for ground. The outermost row of the terminals of a memory to be connected to the outermost row of second pads is used only for power supply or ground. Because of the above structure, lands of stacked vias are formed on the outermost portions of the first conductive layer, and warping of the substrate is suppressed. Here, the outermost rows are those positioned farthest from the IC and on the peripheral side of the package substrate. Since peripheral portions of the package substrate are connected by stacked vias, lands are formed in the first conductive layer, and warping is suppressed. Stacked vias are also formed on the inner side of a memory.

Since first conductive layer (158Fa) is a dedicated wiring layer, no vias, other than via conductors (160Fa) which are part of stacked vias, are formed to penetrate through the inner insulating resin interlayer. Accordingly, the first conductive layer can save a greater region for forming first conductive circuits. A greater number of first conductive circuits are formed in the first conductive layer, enabling the package substrate to mount highly functional electronic components. A dedicated wiring layer is formed in a single layer. Data transmission speed is increased. Signal lines (first conductive circuits) are preferred to be striplines or microstrip lines. When signal lines are striplines, they are sandwiched by the outermost conductive layer and the second conductive layer.

A package substrate according to an embodiment of the present invention has a dedicated wiring layer; an outermost insulating resin interlayer formed on the dedicated insulating resin interlayer; an outermost conductive layer formed on the outermost insulating resin interlayer and including pads for mounting multiple electronic components; and via conductors penetrating through the outermost insulating resin interlayer and connecting the pads and the dedicated wiring layer. The pads include first pads for mounting a first electronic component and second pads for mounting a second electronic component. Moreover, the first pads include those connected to the dedicated wiring layer and those connected to a conductive layer other than the dedicated wiring layer. Also, the second pads include those connected to the dedicated wiring layer and those connected to a conductive layer other than the dedicated wiring layer. Those pads connected to conductive layers other than the dedicated wiring layer are connected to stacked via conductors. A closed circuit is formed by a first pad connected to the dedicated wiring layer, a signal line in the dedicated wiring layer, and a second pad connected to the dedicated wiring layer.

It is an option for a package substrate according to an embodiment of the present invention to have a core substrate with conductive layers. In such a structure, the inner insulating resin interlayer is formed on the core substrate, and the conductive layer of the core substrate corresponds to the second conductive layer. In addition, it is an option for a package substrate according to an embodiment of the present invention to have a buildup layer between the core substrate and the inner insulating resin interlayer. In such a structure, the second conductive layer corresponds to conductive layer (58F) sandwiched by inner insulating resin interlayer (150Fa) and insulating resin interlayer (50F) on the core substrate. The buildup layer includes insulating resin interlayer s and conductive layers, which are alternately laminated. A package substrate having a core substrate and its manufacturing method are described in JP2007-227512A, for example. The entire contents of this publication are incorporated herein by reference. A package substrate according to an embodiment of the present invention may be a coreless substrate. A coreless substrate includes insulating resin interlayers and conductive layers, which are alternately laminated. A coreless substrate and its manufacturing method are described in JP2005-236244A, for example. At least one of the conductive layers is an dedicated wiring layer. The thickness of each insulating resin interlayer of a coreless substrate is 30 μm~60 μm.

Package substrate 10 shown in FIG. 1 has core substrate 30, which may be the same as described in JP2007-227512A. Core substrate 30 includes insulative base board (20z) having first surface (F) and second surface (S) opposite the first surface. Conductive layer (34F) is formed on first surface (F) of insulative base board (20z), and conductive layer (34S) is formed on second surface (S). Insulative base board (20z) has multiple penetrating holes 31, and through-hole conductors 36 are formed in penetrating holes 31 to connect conductive layers (34F) and 34(S). Penetrating holes 31 for forming through-hole conductors may be shaped in an hourglass like that shown in JP2007-227512A.

First buildup layer (55F) is formed on first surface (F) of core substrate 30. The first surface of the core substrate corresponds to the first surface of the insulative base board. First buildup layer (55F) includes insulating resin interlayer (upper insulating resin interlayer) (50F) formed on core substrate 30, second conductive layer (58F) formed on insulating resin interlayer (50F), and via conductors (60F) penetrating through insulating resin interlayer (50F) and connecting second conductive layer (58F) and conductive layer (34F).

First buildup layer (55F) further includes inner insulating resin interlayer (150Fa), which is formed on insulating resin interlayer (50F) and second conductive layer (58F), and first conductive layer (158Fa) formed on inner insulating resin interlayer (150Fa). First conductive layer (158Fa) is a dedicated wiring layer, in which via conductors (160Fa) are formed to penetrate through inner insulating resin interlayer (150Fa). In addition, the first buildup layer further includes uppermost insulating resin interlayer (outermost insulating resin interlayer) (150Fb) formed on inner insulating resin interlayer (150Fa) and first conductive layer (158Fa), uppermost conductive layer (outermost conductive layer) (158Fb) formed on uppermost insulating resin interlayer (150Fb), and via conductors (uppermost via conductors) (160Fb) penetrating through the uppermost insulating resin interlayer and connecting the uppermost conductive layer and first conductive layer. Each of the via conductors (160Fa) penetrating through inner insulating resin interlayer (150Fa) is formed directly under a via conductor (160Fb). Via conductor (160Fa) and via conductor (160Fb) positioned directly thereon form stacked via conductor (160FT), which penetrates through the uppermost insulating resin interlayer and inner insulating resin interlayer to connect the uppermost conductive layer and the second conductive layer. The uppermost conductive layer includes first pads (73Ff) for mounting a first electronic component and second pads (73Fs) for mounting a second electronic component. The uppermost via conductors include first via conductors (uppermost first via conductors) (160Fbf) connecting the first pads and the first conductive layer as well as second via conductors (uppermost second via conductors) (160Fbs) connecting the second pads and the first conductive layer. Stacked via conductors include first stacked via conductors (160FTf) connecting the first pads and the second conductive layer as well as second stacked via conductors (160FTs) connecting the second pads and the second conductive layer. When there are multiple dedicated wiring layers, they are preferred to be formed only in the first buildup layer.

Second buildup layer (55S) is formed on second surface (S) of core substrate 30. Second buildup layer (55S) includes insulating resin interlayers and conductive layers, which are alternately laminated. The first and second buildup layers are preferred to be symmetrical at the core substrate.

Solder-resist layer (70F) having openings (71F) is formed on first buildup layer (55F), and solder-resist layer (70S) having openings (71S) is formed on second buildup layer (55S). First pads (73Ff) and second pads (73Fs) are exposed through openings (71F) of solder-resist layer (70F) formed on first buildup layer (55F). Solder bumps (first solder bumps) (76Ff) are formed on first pads (73Ff), and solder bumps (second solder bumps) (76Fs) are formed on second pads (73Fs). The fusing point of first solder bumps is preferred to be different from that of second solder bumps. Mounting yield and connection reliability are enhanced. In addition, it is easier to replace electronic components. Solder bumps (third solder bumps) (76S) for connection with a motherboard are formed on pads (73S) exposed through openings (71S) of solder-resist layer (70S) formed on second buildup layer (55S). Metal film 72 made of Ni/Au, Ni/Pd/Au or the like is formed on pads (73Ff, 73Fs, 73S). As shown in FIGS. 2 and 7(B), IC chip (110L) is mounted on solder bumps (76Ff) for mounting an IC chip, and memory (110M) is mounted on solder bumps (76Fs) for mounting a memory. Package substrate 10 is mounted on a motherboard through solder bumps (76S) formed on the second buildup layer. The fusing points of the first, second and third solder bumps are preferred to be different from each other. Such a setting increases mounting yield and connection reliability.

Figure 8A:
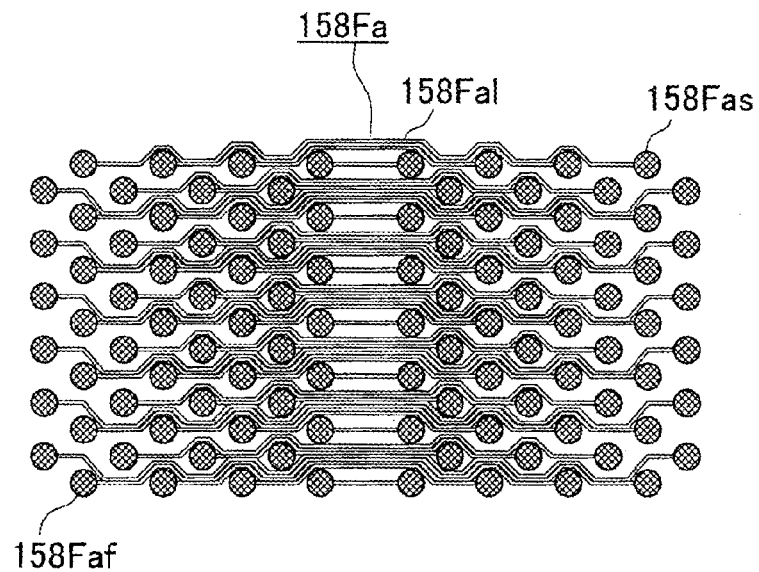
FIG. 8A is a plan view of the first conductive layer of the first embodiment.

FIG. 8(A) is a plan view showing part of dedicated wiring layer (first conductive layer) (158Fa). FIG. 8(A) corresponds to a view taken along (X1-X1) line in FIG. 1. The round conductors in FIG. 8(A) are pads. The pads on the left are first via-conductor pads (158Faf) and those on the right are second via-conductor pads (158Fas). First via conductors (160Fbf) are formed on first via pads, and second via conductors (160Fbs) are formed on second via pads. First conductive layer (158Fa) includes first conductive circuits (158Fal) each connecting a first via-conductor pad (158Faf) and a second via-conductor pad (158Fas). In the package substrate according to the first embodiment, all data transmission between a first electronic component such as a logic chip and a second electronic component such as a memory chip is carried out through the first conductive layer.

Figure 8B:
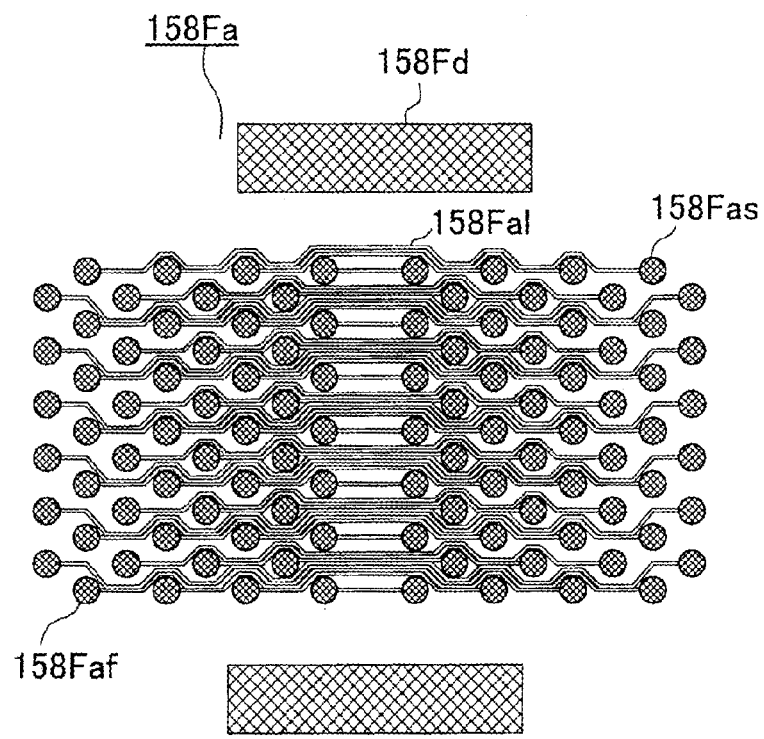
FIG. 8B is a plan view of a first conductive layer of a modified example of the first embodiment.

In the package substrate of the first embodiment, first conductive layer (158Fa) is set at a finer pitch than other conductive layers to increase its wiring density. Thus, the wiring width is narrow (for example, approximately 2~11 µm, most preferably 5 µm) and wiring lines are made thin (for example, approximately 3~11 µm, most preferably 5 µm). The area of the first conductive layer in contact with the inner insulating resin interlayer is 3~15% of the area of the upper surface of the inner insulating resin interlayer (the area of the package substrate). A contact area of less than 3% causes greater variations in the plating thicknesses, and thinner wiring lines tend to break, making it harder to secure connection reliability. On the other hand, a contact area exceeding 15% causes the volumes of conductive circuits to be different and unbalanced on the upper and lower surfaces of the package substrate. Namely, the upper-side copper volume is more than that on the lower side, causing upper-side rigidity to be higher than lower-side rigidity. As a result, the substrate is more likely to warp by thermal stress. By setting the contact area at 3~15%, warping is less likely to occur, and higher connection reliability is achieved. FIG. 8(A) shows a structure where the area of copper only in the dedicated wiring layer (that is, first conductive circuits (158Fal), first via-conductor pads (158Faf), second via-conductor pads (158Fas) and lands of via conductors (160Fa) (see FIG. 1)) is set greater than 3% of the area of the inner insulating resin interlayer. FIG. 8(B) shows a structure where the area of copper only in the dedicated wiring layer is set less than 3% of the inner insulating resin interlayer. For such a structure, dummy patterns (158Fd) are formed to make the area of copper more than 3%.

First conductive layer (158Fa) is sandwiched by planar layer (158FbP) included in the uppermost conductive layer and planar layer (58Fp) included in the second conductive layer, and striplines are formed therein. By so setting, first conductive circuits have enhanced transmission properties.

In the package substrate of the first embodiment, since the dedicated wiring layer is formed directly under outermost insulating resin interlayer (150Fb), the wiring distance between electronic components is shortened, increasing signal transmission speed between electronic components. Since a package substrate according to an embodiment of the present invention has the dedicated wiring layer, the electrical characteristics of signal lines become similar, achieving uniform transmission time of signals in bytes. Signals are properly processed even at a higher transmission speed. Processing time will not be delayed even with a greater amount of transmission data.

Method for Manufacturing Package Substrate of the First Embodiment

FIG. 3~9 show a method for manufacturing package substrate 10 of the first embodiment.

(1) A starting substrate 20 having surface (F) and its opposing second surface (S) is prepared. The starting substrate is preferred to be a double-sided copper-clad laminate. A double-sided copper-clad laminate is made of insulative base board (20z) having first surface (F) and its opposing second surface (S) along with metal foils (22, 22) laminated respectively on both surfaces (FIG. 3(A)). The starting substrate of the first embodiment is a double-sided copper-clad laminate. A black-oxide treatment is performed on the surface of copper foil 22.

Insulative base board (20z) is made of resin and reinforcing material. Examples of reinforcing material are glass cloth, aramid fibers, glass fibers and the like. Examples of resin are epoxy resins, BT (bismaleimide triazine) resins, and the like.

Figure 3A:
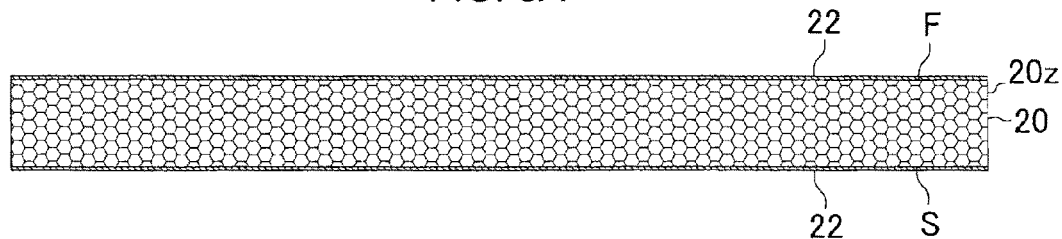
FIGS. 3A-3C show views of processes in a method for manufacturing a package substrate of the first embodiment.
Figure 3B:
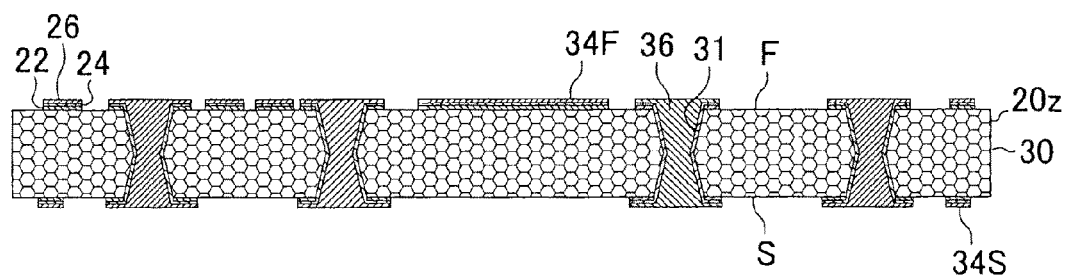
Figure 3C:
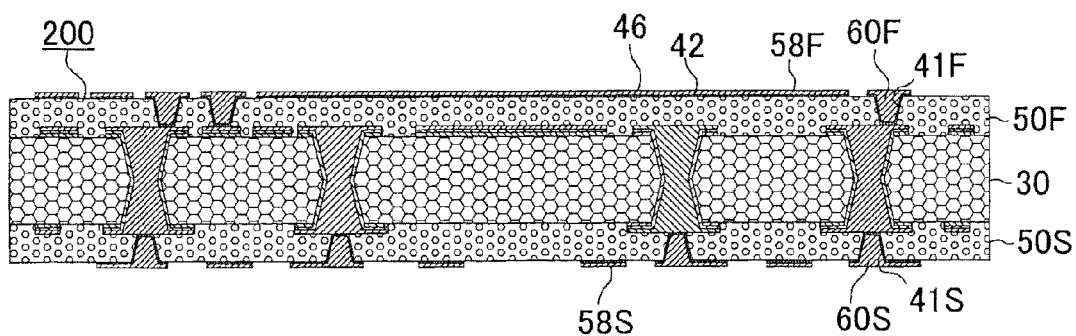

(2) The double-sided copper-clad laminate is processed to form core substrate 30 having upper and lower conductive layers (34F, 34S) made up of metal foil 22, electroless plated film 24 and electrolytic plated film 26, and through-hole conductors 36 formed in penetrating holes 31 (FIG. 3(B)). The first surface of core substrate 30 corresponds to the first surface of insulative base board (20z), and the second surface of core substrate 30 corresponds to the second surface of insulative base board (20z). Core substrate 30 may be manufactured by a method described in U.S. Pat. No. 7,786,390, for example. The entire contents of this publication are incorporated herein by reference.

(3) Upper insulating resin interlayer (50F) is formed on first surface (F) of core substrate 30, and lower insulating resin interlayer (50S) is formed on second surface (S) of core substrate 30. Via-conductor openings (41F, 41S) are formed respectively in insulating resin interlayers (50F, 50S) by using a $CO_2$ gas laser. Electroless copper-plated layer 42 is formed on insulating resin interlayers (50F, 50S) and on the inner walls of openings (41F, 41S). Plating resist is formed on electroless copper-plated film 42. Electrolytic copper-plated film 46 is formed on portions of electroless copper-plated film 42 exposed from the plating resist. At that time, openings (41F, 41S) are filled with electrolytic plated film 46 to form via conductors (60F, 60S). Plating resist is removed. Electroless plated film 42 exposed from electrolytic plated film 46 is removed. Second conductive layer (upper second conductive layer) (58F) is formed on insulating resin interlayer (50F). Second conductive layer (lower second conductive layer) (58S) is formed on insulating resin interlayer (50S) (FIG. 3(C)). Second conductive layers (58F, 58S) and via conductors (60F, 60S) may be formed using the method described in JP2012-209553A, for example. The entire contents of this publication are incorporated herein by reference. Accordingly, intermediate substrate 200 is formed.

(4) Resin film with transfer copper foil is prepared. The resin film with transfer copper foil 48 is laminated on upper second conductive layer (58F) and upper insulating resin interlayer (50F) as well as on lower second conductive layer (58S) and lower insulating resin interlayer (50S). Then, the resin film is cured so that inner insulating resin interlayer (upper inner insulating resin interlayer) (150Fa) is formed on upper second conductive layer (58F) and upper insulating resin interlayer (50F), while inner insulating resin interlayer (lower inner insulating resin interlayer) (150Sa) is formed on lower second conductive layer (58S) and lower insulating resin interlayer (50S) (FIG. 4(A)). In the present embodiment, since a transfer foil is formed in advance of the lamination, it has a uniformly thin thickness.

Figure 4A:
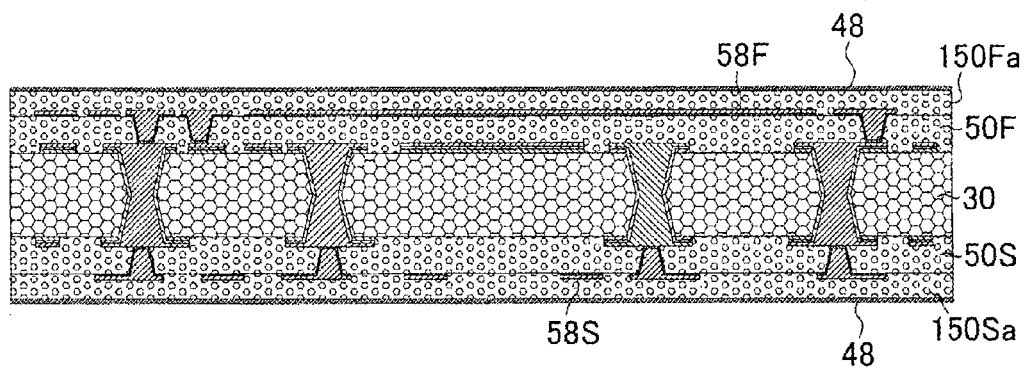
FIGS. 4A-4C show views of processes in the method for manufacturing a package substrate of the first embodiment.
Figure 4B:
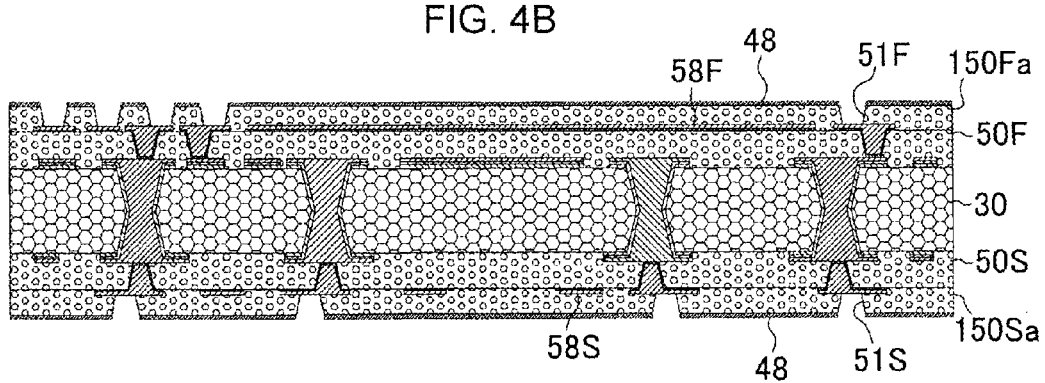

(5) Using a laser, openings (51F) are formed in upper inner insulating resin interlayer (150Fa) to reach second conductive layer (58F), while openings (51S) are formed in lower inner insulating resin interlayer (150Sa) to reach second conductive layer (58S) (FIG. 4(B)). Openings (51F, 51S) are roughened. The roughness of resin on the side walls of openings (51F, 51S) is 0.3~0.9 µm, preferably 0.5 µm.

Figure 4C:
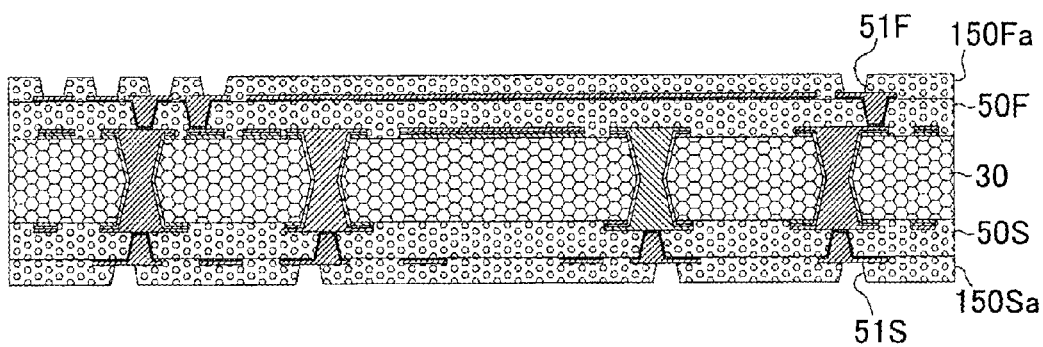

(6) The transfer copper foils are removed by etching and surfaces of inner insulating resin interlayers (150Fa, 150Sa) are exposed (FIG. 4(C)). The roughness (Ra) of resin below the wiring layer for data transmission (the surface roughness of inner insulating resin interlayer (150Fa)) is 0.1 µm or less, which is smaller than the surface roughness of the resin in via-conductor openings (51F) for first via conductors (including second via conductors and third via conductors). The roughness of the resin in vias is different from that of the resin under the wiring layer. After the holes are formed in the copper by using a laser, the holes undergo desmearing (removing residue from via bottoms), and then the copper is removed by etching. Therefore, the resin under copper foils is not roughened. As a result, a fine-pitch wiring layer is formed on the inner insulating resin interlayer with a smaller surface roughness.

Figure 5A:
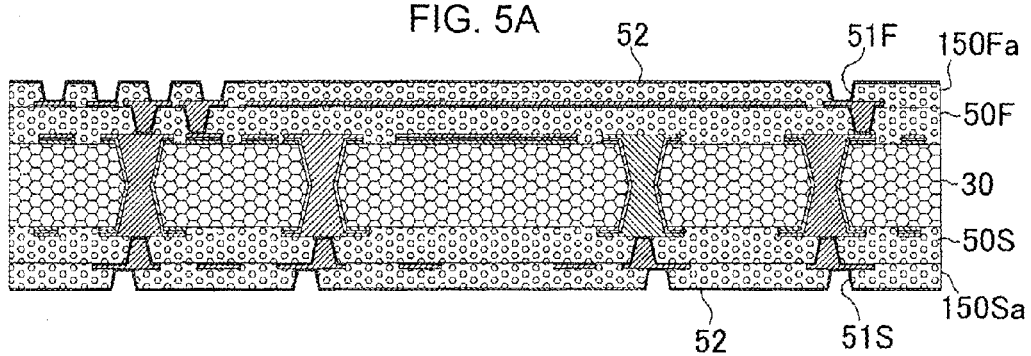
FIGS. 5A-5D show views of processes in the method for manufacturing a package substrate of the first embodiment.

(7) Seed layer 52 is formed by electroless plating or sputtering on surfaces of inner insulating resin interlayers (150Fa, 150Sa) and in openings (51F, 51S) (FIG. 5(A)).

Figure 5B:
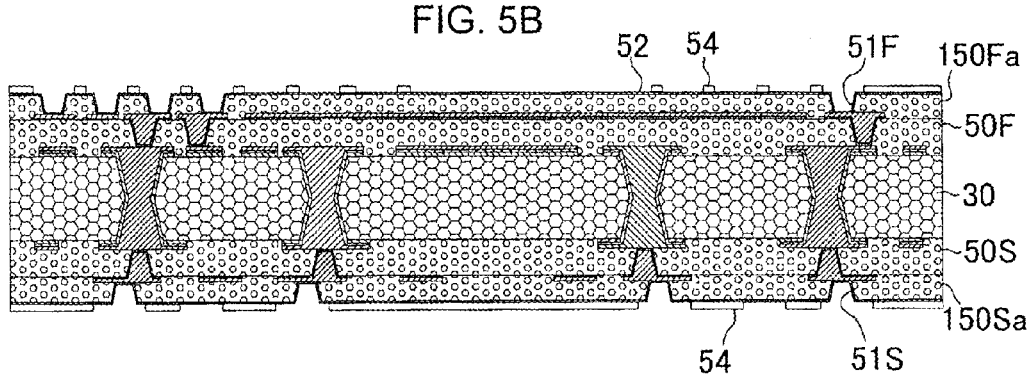

(8) Plating resist 54 is formed on seed layer 52 (FIG. 5(B)).

Figure 5C:
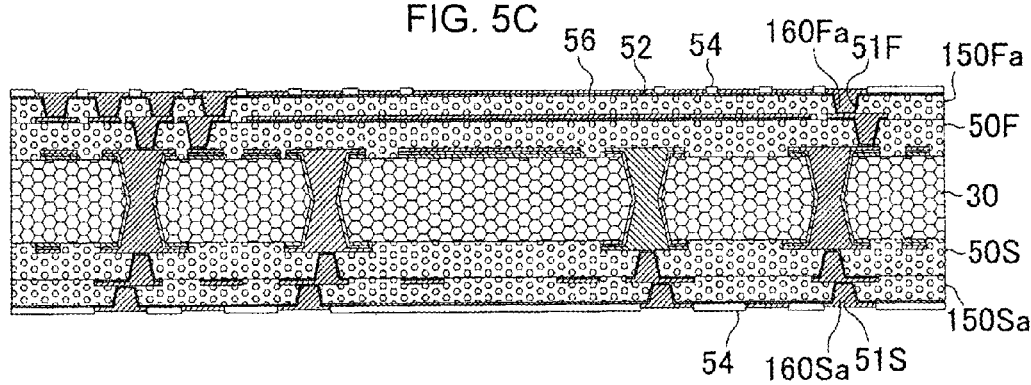
Figure 5D:
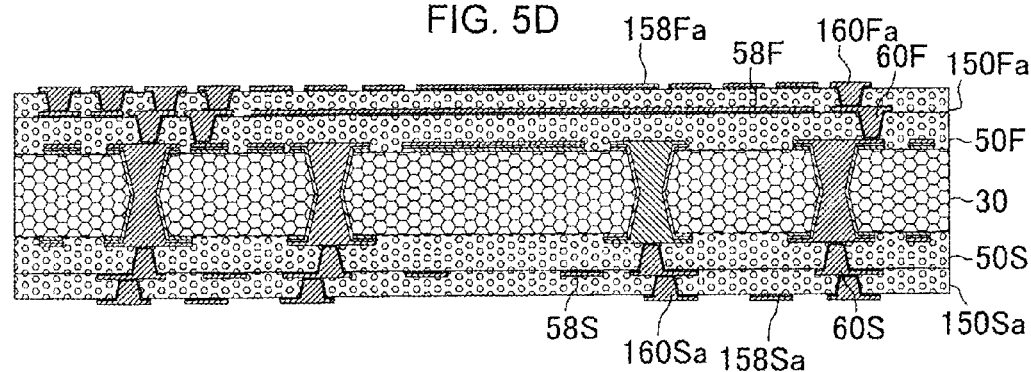

(9) Electrolytic copper-plated film 56 is formed on portions of seed layer 52 exposed from plating resist 54 (FIG. 5(C)). During that time, openings (51F, 51S) are filled with electrolytic plated film 56 to form via conductors (160Fa, 160Sa).

(10) The plating resist is removed. Portions of seed layer 52 exposed from electrolytic copper-plated film 56 are removed so that first conductive layer (upper first conductive layer) (158Fa) made of seed layer 52 and electrolytic copper-plated film 56 on the seed layer is formed on upper inner insulating resin interlayer (150Fa), while first conductive layer (lower first conductive layer) (158Sa) is formed on lower inner insulating resin interlayer (150Sa) (FIG. 5(D)). FIG. 8 shows part of first conductive layer (158Fa). FIG. 8 shows plan views. The L/S (line/space) of the first conductive circuits in the first conductive layer is 5/5 µm, for example. First via-conductor pads (158Faf) and second via-conductor pads (158Fas) are also formed at the same time. After openings (51F, 51S) are formed in insulating resin interlayers made of resin film with transfer copper foils, the transfer copper foils are removed and the seed layers are formed. Accordingly, insulating resin interlayers (150F, 150S) have flat surfaces, enabling the formation of thin uniform seed layers. As a result, first conductive layer (158Fa) is made thin, and wiring widths are made finer.

(11) Processes in (4)~(10) above are repeated to form outermost insulating resin interlayers (150Fb, 150Sb). Outermost conductive layers (158Fb, 158Sb) are respectively formed on the outermost insulating resin interlayers. Via conductors (160Fb, 160Sb) are formed to penetrate through outermost insulating resin interlayers (150Fb, 150Sb) (FIG. 6(A)). Via conductor (160Fb) is formed directly on via conductor (160Fa) penetrating through inner insulating resin interlayer (150Fa) and forms stacked via (160FT). It is an option to form a triple-layer stacked via by including via conductor (60F) in insulating resin interlayer (50F).

Upper outermost conductive layer (158Fb) includes first and second pad groups. The second pad group formed of first, second, third and fourth groups. As shown in FIG. 7, the second pad group surrounds the first pad group. Each group in the second pad group is formed on an outer side of the first pad group.

Figure 6A:
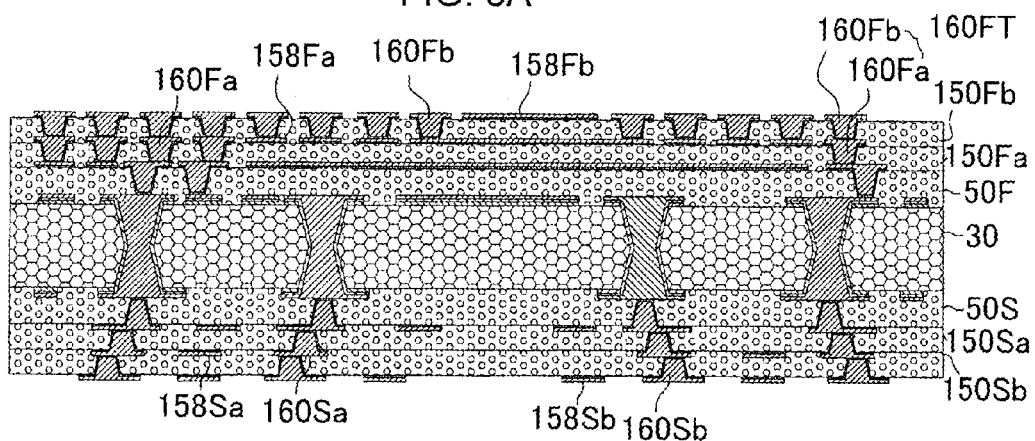
FIGS. 6A-6C show views of processes in the method for manufacturing a package substrate of the first embodiment.
Figure 6B:
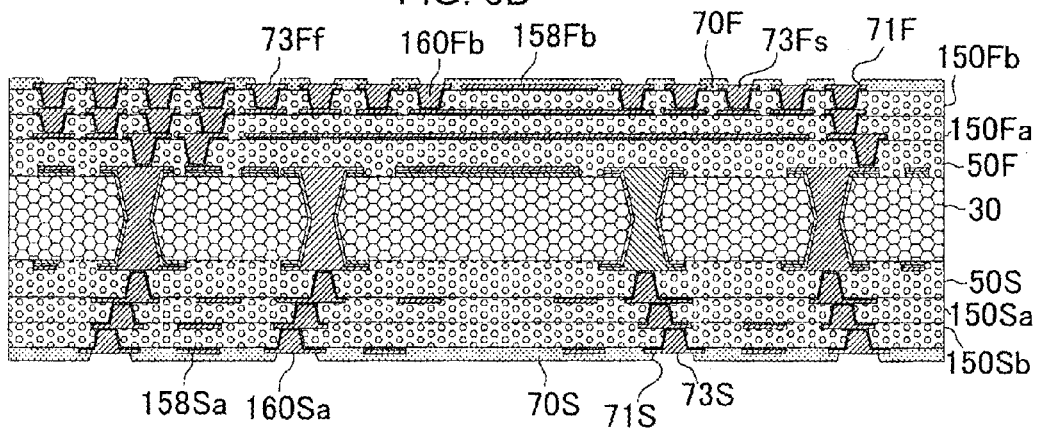

(12) Upper solder-resist layer (70F) having openings (71F) is formed on the first buildup layer, while lower solder-resist layer (70S) having openings (71 S) is formed on the second buildup layer (FIG. 6(B)). Top surfaces of first pads (73Ff) and second pads (73Fs) are exposed through openings (71F) of upper solder-resist layer (70F). The top surfaces of the conductive layer and via lands exposed through openings (71S) of lower solder-resist layer (70S) work as pads (73S) for connection with a motherboard.

Figure 6C:
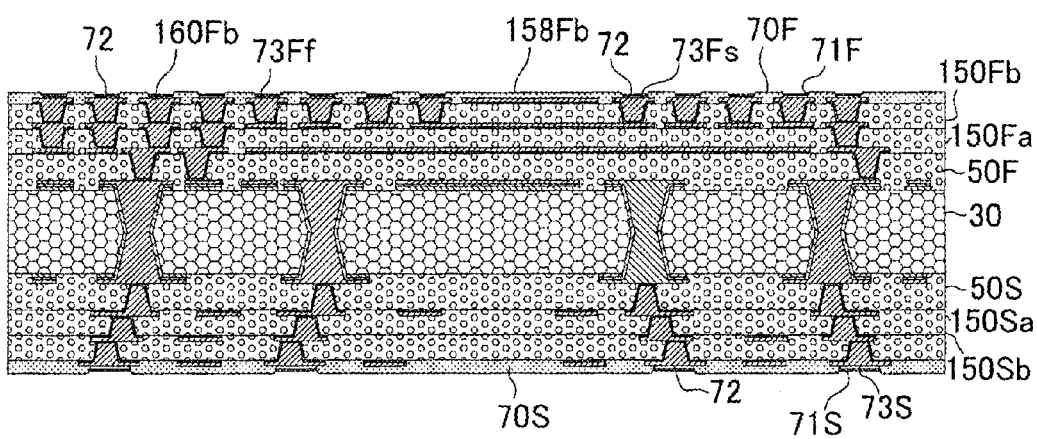

(13) A nickel-plated layer is formed on pads (73Ff, 73Fs, 73S), and a gold-plated layer is further formed on the nickel-plated layer so as to form metal layer 72 made of nickel-plated layer and gold-plated layer (FIG. 6(C)). Instead of a nickel-gold layer, a nickel-palladium-gold layer or an OSP film may also be formed.

(14) Solder balls are mounted on pads (73Ff, 73Fs, 73S), and are reflowed to form solder bumps (76Ff, 76Fs, 76S). Package substrate 10 is completed (FIG. 1).

(15) Logic IC chip (110L) is mounted on solder bumps (76Ff) on the first pads, and memories (110M) are mounted on solder bumps (76Fs) on the second pads (FIGS. 2 and 7(B)). Then, underfill 114 is filled between the package substrate and IC chip (110L) and memories (110M) (FIG. 2).

According to the method for manufacturing a package substrate of the first embodiment, the substrate is formed using resin film with transfer copper foil. Since a seed layer is formed after openings are formed and the transfer foil is removed, a thinner seed layer is formed while varied thicknesses are suppressed in the seed layer. A seed layer can be also formed by sputtering. The first conductive layer, which is a dedicated wiring layer for data transmission, is made thinner. Since the seed layer is thin, the amount of etching is small when the seed layer is removed to form conductive circuits. Accordingly, fine-pitch conductive circuits are formed in the first conductive layer. For example, fine signal lines with the L/S of 8 μm/8 μm or smaller are formed in the first conductive layer. Since there is no conductive layer formed on the lower inner insulating resin interlayer in the embodiment, it is an option not to form a lower inner insulating resin interlayer. In such a structure, to reduce warping in the package substrate, an insulating resin interlayer in the second buildup layer is preferred to have a greater thickness than the rest of the insulating resin interlayers. The thickness of such a thicker insulating resin interlayer is obtained by adding the thickness of the upper inner insulating resin interlayer and the thickness of an insulating resin interlayer other than the upper inner insulating resin interlayer.

Second Embodiment

Figure 9:
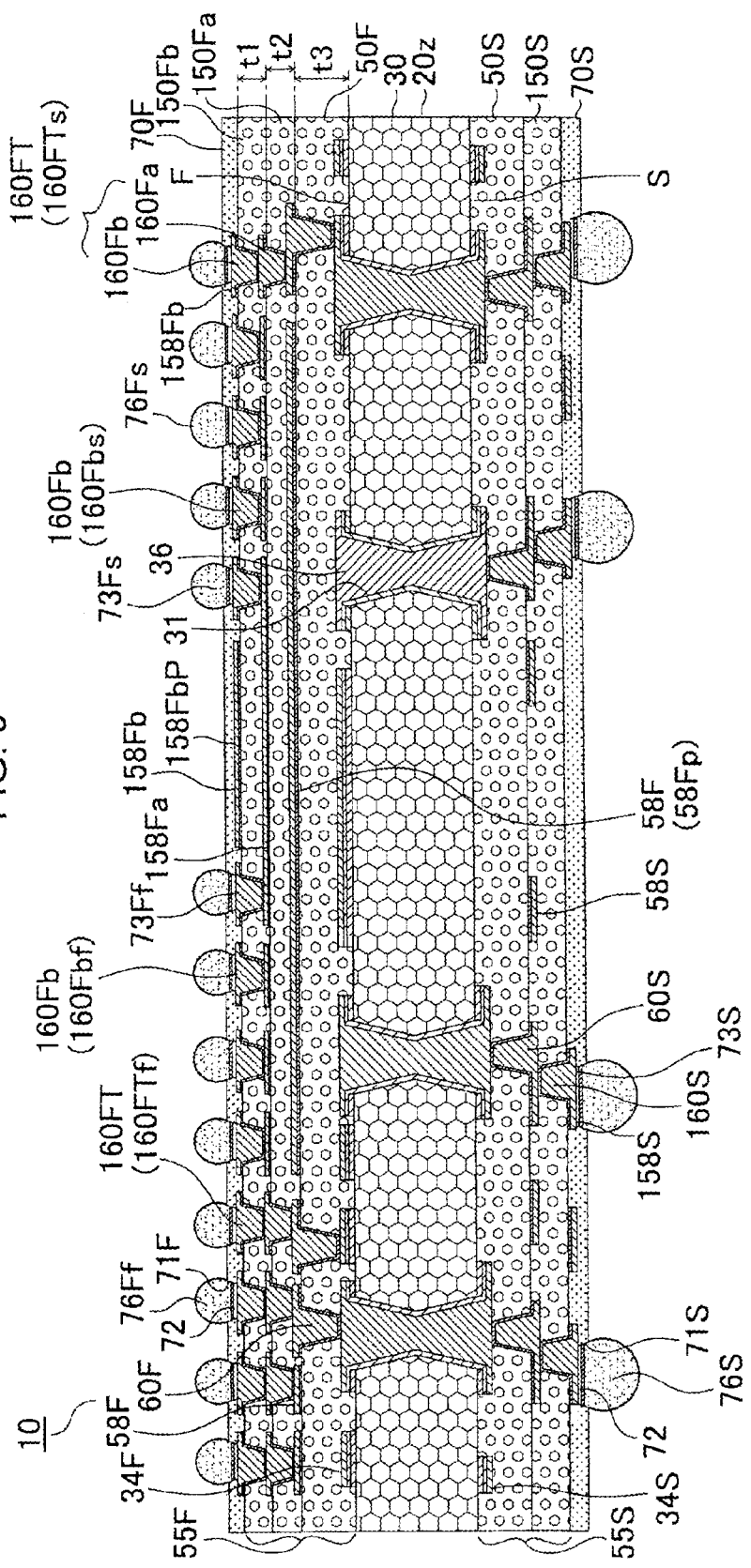
FIG. 9 shows a cross-sectional view of a package substrate according to a second embodiment.

FIG. 9 shows a package substrate according to a second embodiment. The substrate of the second embodiment has multiple dedicated wiring layers. In the second embodiment, the number of insulating resin interlayers in second buildup layer (55S) on second surface (S) of core substrate 30 is two, that is, insulating resin interlayer (50S) and insulating resin interlayer (150S). Meanwhile, in first buildup layer (55F) on first surface (F), thickness (t1) of outermost insulating resin interlayer (150Fb) and thickness (t2) of inner insulating resin interlayer (150Fa) are each set at 7.5 μm to 20 μm, and thickness (t3) of insulating resin interlayer (50F) is 15 μm~40 μm. Thickness (t1) of outermost insulating resin interlayer (150Fb) and thickness (t2) of inner insulating resin interlayer (150Fa) are each set to be ½~⅓ of thickness (t3) of the insulating resin interlayer. Because of their smaller thickness, fine-pitch via conductors (160Fb, 160Fa) are formed in outermost insulating resin interlayer (150Fb) and inner insulating resin interlayer (150Fa).

A multi-chip module may include wiring layers having wiring lines that connect LSIs. An LSI may include a power line and a ground line. Of the wiring layers, at least one wiring layer may have a power line or a ground line and a wiring line that connects two LSIs. Therefore, it may be difficult for such a multi-chip module to increase transmission speed between the electronic components.

A package substrate according to an embodiment of the present invention is less likely to warp and is capable of increasing signal transmission speeds between electronic components, and another embodiment of the present invention is a method for manufacturing such a package substrate.

According to an embodiment of the present invention, a package substrate includes the following: an outermost insulating resin interlayer having a first surface and a second surface opposite the first surface; an outermost conductive layer formed on the first surface of the outermost insulating resin interlayer and including a first pad group made up of multiple first pads for mounting a first electronic component and a second pad group made up of multiple second pads for mounting a second electronic component; a first conductive layer formed under the second surface of the outermost insulating resin interlayer and including multiple first conductive circuits; an inner insulating resin interlayer formed under the second surface of the outermost insulating resin interlayer and under the first conductive layer; a second conductive layer formed under the inner insulating resin interlayer; first via conductors penetrating through the outermost insulating resin interlayer and connecting the first conductive layer and the first pads; second via conductors penetrating through the outermost insulating resin interlayer and connecting the first conductive layer and the second pads; and third via conductors penetrating through the inner insulating resin interlayer and positioned directly under first via conductors or second via conductors that penetrate through the outermost insulating resin interlayer. The third via conductors and first via conductors or second via conductors are set to be stacked vias, and each of the first conductive circuits in the first conductive layer is set to connect a first pad of the first pad group and a second pad of the second pad group.

According to another embodiment of the present invention, a method for manufacturing a package substrate includes: forming an insulating resin interlayer having a conductive layer and via conductors; forming an inner insulating resin interlayer having a copper foil on the insulating resin interlayer; using a laser, forming openings through the copper foil and the inner insulating resin interlayer to reach the lower conductive layer; removing the copper foil by etching; forming a seed layer on the first surface and in the openings of the inner insulating resin interlayer; forming a plating resist on the seed layer to have a predetermined pattern; by forming an electrolytic plated film where no plating resist is formed, forming via conductors in the openings penetrating through the inner insulating resin interlayer as well as forming wiring lines for data transmission between electronic components; removing the plating resist while removing the seed layer exposed from the electrolytic plated film; forming an outermost insulating resin interlayer on the dedicated wiring lines and the surface of the inner insulating resin interlayer; on the outermost insulating resin interlayer, forming an outermost conductive layer that includes first pads for mounting a first electronic component and second pads for mounting a second electronic component; forming first via conductors penetrating through the outermost insulating resin interlayer and connecting the first pads and the dedicated wiring layer; and forming second via conductors penetrating through the outermost insulating resin interlayer and connecting the second pads and the dedicated wiring layer. The via conductors penetrating through the inner insulating resin interlayer and the first or second via conductors are set to form stacked via conductors, and each of the first conductive circuits in the first conductive layer is set to connect a first pad of the first pad group and a second pad of the second pad group.

Obviously, numerous modifications and variations of the present invention are possible in light of the above teachings. It is therefore to be understood that within the scope of the appended claims, the invention may be practiced otherwise than as specifically described herein.

What is claimed is:

1. A package substrate, comprising:
an outermost insulating resin interlayer;
an outermost conductive layer formed on a surface of the outermost insulating resin interlayer and comprising a plurality of first pads and a plurality of second pads such that the plurality of first pads is positioned to mount a first electronic component and the plurality of second pads is positioned to mount a second electronic component;

a first conductive layer consisting of a plurality of first conductive circuits and formed such that the outermost insulating resin interlayer is formed on the first conductive layer and that the plurality of first conductive circuits is connecting the plurality of first pads and the plurality of second pads, respectively;

an inner insulating resin interlayer formed such that the first conductive layer is formed on the inner insulating resin interlayer;

a second conductive layer formed such that the inner insulating resin interlayer is formed on the second conductive layer;

a plurality of via conductors penetrating through the outermost insulating resin interlayer and comprising a plurality of first via conductors and a plurality of second via conductors such that the first via conductors are connecting the first conductive layer and the plurality of first pads and that the second via conductors are connecting the first conductive layer and the plurality of second pads; and a plurality of third via conductors penetrating through the inner insulating resin interlayer and positioned such that the first via conductors and third via conductors form a plurality of stacked via conductors penetrating through the outermost and inner insulating resin interlayers, wherein the plurality of second pads includes a plurality of outermost second pads positioned in an outermost row of the plurality of second pads and formed such that the plurality of outermost second pads is connected to one of a power supply circuit or a ground circuit, and the plurality of second via conductors includes a plurality of outermost second via conductors connected to the plurality of outermost second pads, and the plurality of third via conductors includes a plurality of outer third via conductors positioned such that the outermost second via conductors and outer third via conductors form a plurality of outer stacked via conductors penetrating through the outermost and inner insulating resin interlayers.

2. A package substrate according to claim 1, wherein the plurality of third via conductors has a plurality of land portions formed on the inner insulating resin interlayer, respectively, the first conductive layer includes the plurality of first conductive circuits and the land portions of the third via conductors, and the plurality of first conductive circuits is a plurality of data transmission lines configured to transmit data between the first and second electronic components.

3. A package substrate according to claim 1, wherein the plurality of third via conductors has a plurality of land portions formed on the inner insulating resin interlayer, respectively, the first conductive layer is consisting of the plurality of first conductive circuits and the land portions of the third via conductors, and the plurality of first conductive circuits is a plurality of data transmission lines configured to transmit data between the first and second electronic components.

4. A package substrate according to claim 1, wherein the outermost conductive layer, the first conductive circuits and the second conductive layer form a stripline structure.

5. A package substrate according to claim 1, wherein the first electronic component is a logic IC device, and the second electronic component is a memory device.

6. A package substrate according to claim 5, wherein the plurality of second pads includes a plurality of pads positioned in an outermost row, and the pads positioned in an outermost row are formed to connect to one of power source and ground.

7. A package substrate according to claim 1, wherein the first and second via conductors are formed in openings formed in the outermost insulating resin interlayer such that the openings in the outermost insulating resin interlayer has side walls having a roughness which is greater than a surface roughness of the inner insulating resin interlayer on which the first conductive layer is formed, and the third via conductors are formed in openings formed in the inner insulating resin interlayer such that the openings in the inner insulating resin interlayer has side walls having a roughness which is greater than the surface roughness of the inner insulating resin interlayer on which the first conductive layer is formed.

8. A package substrate according to claim 7, wherein the roughness of the side walls of the openings in the outermost and inner insulating resin interlayers is in a range of 0.3 μm to 0.9 μm.

9. A package substrate according to claim 7, wherein the surface roughness of the inner insulating resin interlayer on which the first conductive layer is formed is in a range of 0.1 μm or less.

10. A package substrate according to claim 8, wherein the surface roughness of the inner insulating resin interlayer on which the first conductive layer is formed is in a range of 0.1 μm or less.

11. A package substrate according to claim 1, wherein the plurality of third via conductors is positioned directly underneath the plurality of first via conductors such that the first via conductors and third via conductors form the plurality of stacked via conductors penetrating through the outermost and inner insulating resin interlayers.

12. A package substrate according to claim 11, wherein the plurality of third via conductors has a plurality of land portions formed on the inner insulating resin interlayer, respectively, the first conductive layer includes the plurality of first conductive circuits and the land portions of the third via conductors, and the plurality of first conductive circuits is a plurality of data transmission lines configured to transmit data between the first and second electronic components.

13. A package substrate according to claim 11, wherein the plurality of third via conductors has a plurality of land portions formed on the inner insulating resin interlayer, respectively, the first conductive layer is consisting of the plurality of first conductive circuits and the land portions of the third via conductors, and the plurality of first conductive circuits is a plurality of data transmission lines configured to transmit data between the first and second electronic components.

14. A package substrate according to claim 11, wherein the outermost conductive layer, the first conductive circuits and the second conductive layer form a stripline structure.

15. A package substrate according to claim 11, wherein the first electronic component is a logic IC device, and the second electronic component is a memory device.

16. A package substrate according to claim 15, wherein the plurality of second pads includes a plurality of pads positioned in an outermost row, and the pads positioned in an outermost row are formed to connect to one of power source and ground.

17. A package substrate according to claim 11, wherein the first and second via conductors are formed in openings formed in the outermost insulating resin interlayer such that the openings in the outermost insulating resin interlayer has side walls having a roughness which is greater than a surface roughness of the inner insulating resin interlayer on which the first conductive layer is formed, and the third via conductors are formed in openings formed in the inner insulating resin interlayer such that the openings in the inner insulating resin interlayer has side walls having a roughness which is greater than the surface roughness of the inner insulating resin interlayer on which the first conductive layer is formed.

18. A method for manufacturing a package substrate, comprising:
    forming a first conductive layer consisting of a plurality of conductive circuits on an inner insulating resin interlayer;
    forming a plurality of via conductors through the inner insulating resin interlayer;
    forming an outermost insulating resin interlayer on the inner insulating resin interlayer such that the outermost insulating resin interlayer covers the plurality of conductive circuits;
    forming a plurality of via conductors comprising a plurality of first via conductors and a plurality of second via conductors such that the plurality of first via conductors and the plurality of second via conductors penetrate through the outermost insulating resin interlayer and connect to the plurality of conductive circuits on the inner insulating resin interlayer and that the plurality of first via conductors and the plurality of via conductors in the inner insulating resin interlayer form a plurality of stacked via conductors; and
    forming on the outermost insulating resin interlayer an outermost conductive layer comprising a plurality of first pads and a plurality of second pads such that the plurality of first pads is positioned to mount a first electronic component and connected to the first via conductors, that the plurality of second pads is positioned to mount a second electronic component and connected to the second via conductors and that the first and second pads are connected through the conductive circuits, respectively,
    wherein the plurality of second pads includes a plurality of outermost second pads positioned in an outermost row of the plurality of second pads and formed such that the plurality of outermost second pads is to be connected to one of a power supply circuit or a ground circuit, the plurality of second via conductors includes a plurality of outermost second via conductors connected to the plurality of outermost second pads, and the plurality of via conductors includes a plurality of outer via conductors positioned such that the outermost second via conductors and outer via conductors form a plurality of outer stacked via conductors penetrating through the outermost and inner insulating resin interlayers.

19. A method for manufacturing a package substrate according to claim 18, wherein the conductive circuits and the via conductors in the inner insulating resin interlayer are formed in a same process such that the forming of the conductive circuits and the forming of the via conductors in the inner insulating resin interlayer comprise laminating the inner insulating resin interlayer having a copper foil on a surface of an insulating resin interlayer having a conductive layer; applying laser upon the inner insulating resin interlayer such that a plurality of openings is formed through the copper foil and the inner insulating resin interlayer to reach the conductive layer formed on the insulating resin interlayer, applying etching on the copper foil such that the copper foil is removed from the inner insulating resin interlayer, forming a seed layer on the inner insulating resin interlayer such that the seed layer is formed on a surface of the inner insulating resin interlayer and in the openings of the inner insulating resin interlayer, forming on the seed layer a plating resist having a pattern exposing portions of the seed layer, applying electrolytic plating on the portions of the seed layer such that the electrolytic plated film is formed on the portions of the seed layer through the pattern, and removing the plating resist and the seed layer exposed from the electrolytic plated film such that the plurality of conductive circuits is formed on the inner insulating resin interlayer and the plurality of via conductors is formed through the inner insulating resin interlayer.

20. A method for manufacturing a package substrate according to claim 18, wherein the plurality of via conductors in the inner insulating resin interlayer is positioned directly underneath the plurality of first via conductors such that the first via conductors and via conductors in the inner insulating resin interlayer form the plurality of stacked via conductors penetrating through the outermost and inner insulating resin interlayers.

* * * * *